United States Patent
Tran

(10) Patent No.: US 6,720,638 B2
(45) Date of Patent: Apr. 13, 2004

(54) SEMICONDUCTOR CONSTRUCTIONS, AND METHODS OF FORMING SEMICONDUCTOR CONSTRUCTIONS

(75) Inventor: Luan C. Tran, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/355,678

(22) Filed: Jan. 30, 2003

(65) Prior Publication Data

US 2003/0235975 A1 Dec. 25, 2003

Related U.S. Application Data

(62) Division of application No. 10/177,056, filed on Jun. 21, 2002.

(51) Int. Cl.⁷ ............................................... H01L 29/00
(52) U.S. Cl. ........................ 257/499; 257/506; 257/508; 257/520
(58) Field of Search ................................ 257/499, 501, 257/506, 508, 509, 510, 520

(56) References Cited

U.S. PATENT DOCUMENTS

| 4,766,090 | A | | 8/1988 | Coquin et al. | |
|---|---|---|---|---|---|
| 5,099,304 | A | * | 3/1992 | Takemura et al. | 257/647 |
| 6,037,239 | A | | 3/2000 | Jennings | |
| 6,096,621 | A | | 8/2000 | Jennings | |
| 6,130,140 | A | | 10/2000 | Gonzalez | |
| 6,133,105 | A | * | 10/2000 | Chen et al. | 438/296 |
| 6,133,116 | A | * | 10/2000 | Kim et al. | 438/430 |
| 6,277,709 | B1 | | 8/2001 | Wang et al. | |
| 6,440,793 | B1 | | 8/2002 | Divakaruni et al. | |
| 6,465,325 | B2 | * | 10/2002 | Ridley et al. | 438/428 |
| 2002/0076879 | A1 | | 6/2002 | Lee et al. | |
| 2002/0196651 | A1 | | 12/2002 | Weis | |
| 2003/0013272 | A1 | | 1/2003 | Hong et al. | |

OTHER PUBLICATIONS

COB Stack DRAM Cell Technology beyond 100 nm Technology Node; Yongjik Park & Kinam Kim; pp. 349.1–349.3.

* cited by examiner

Primary Examiner—Tuan H. Nguyen
(74) Attorney, Agent, or Firm—Wells St. John P.S.

(57) ABSTRACT

The invention includes a semiconductor construction. The construction includes a semiconductive material having a surface and an opening extending through the surface. An electrically insulative liner is along a periphery of the opening. A mass comprising one or more of silicon, germanium, metal, metal silicide and dopant is within a bottom portion of the opening, and only partially fills the opening. The mass has a top surface. An electrically insulative material is within the opening and over the top surface of the mass. The top surface of the mass is at least about 200 Angstroms beneath the surface of the semiconductive material. The invention also includes methods of forming semiconductor constructions.

47 Claims, 5 Drawing Sheets

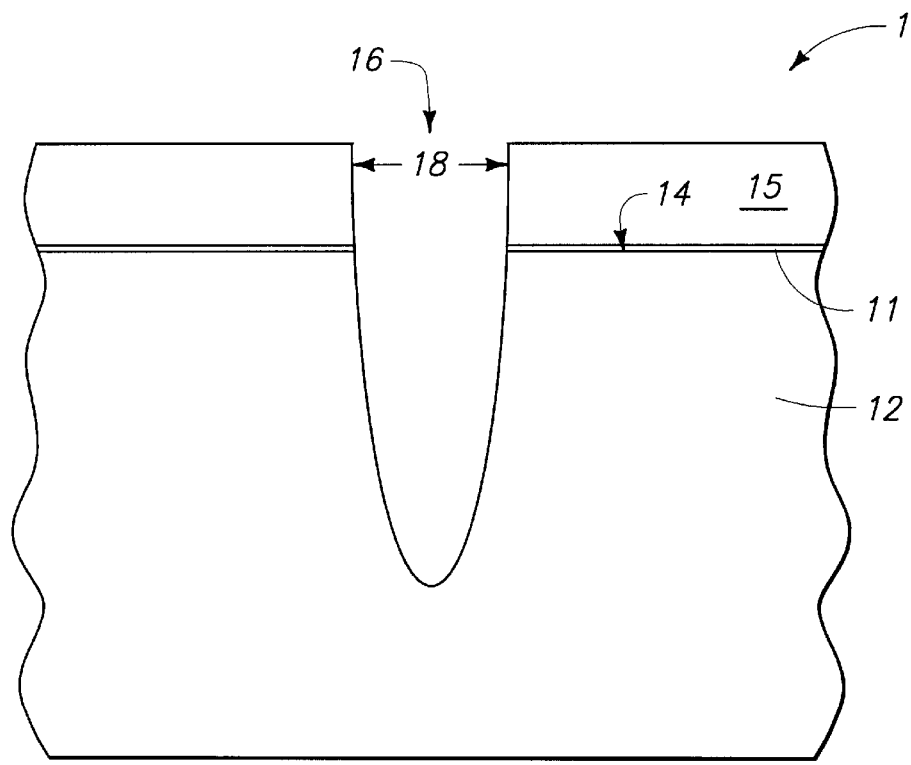
_Fig. 1_
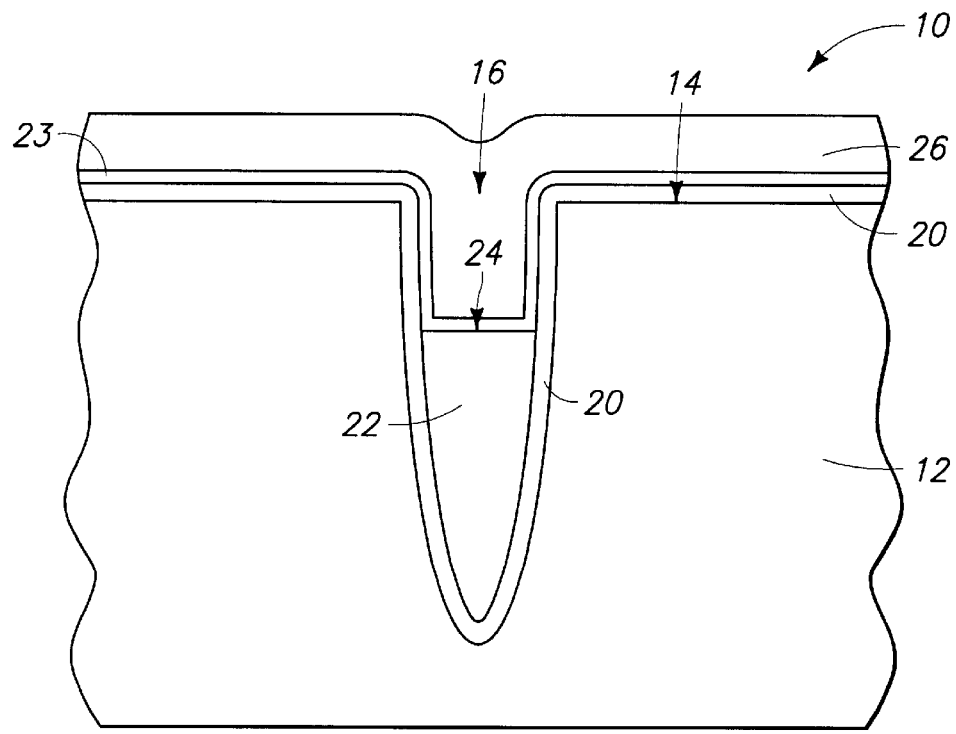
_Fig. 2_

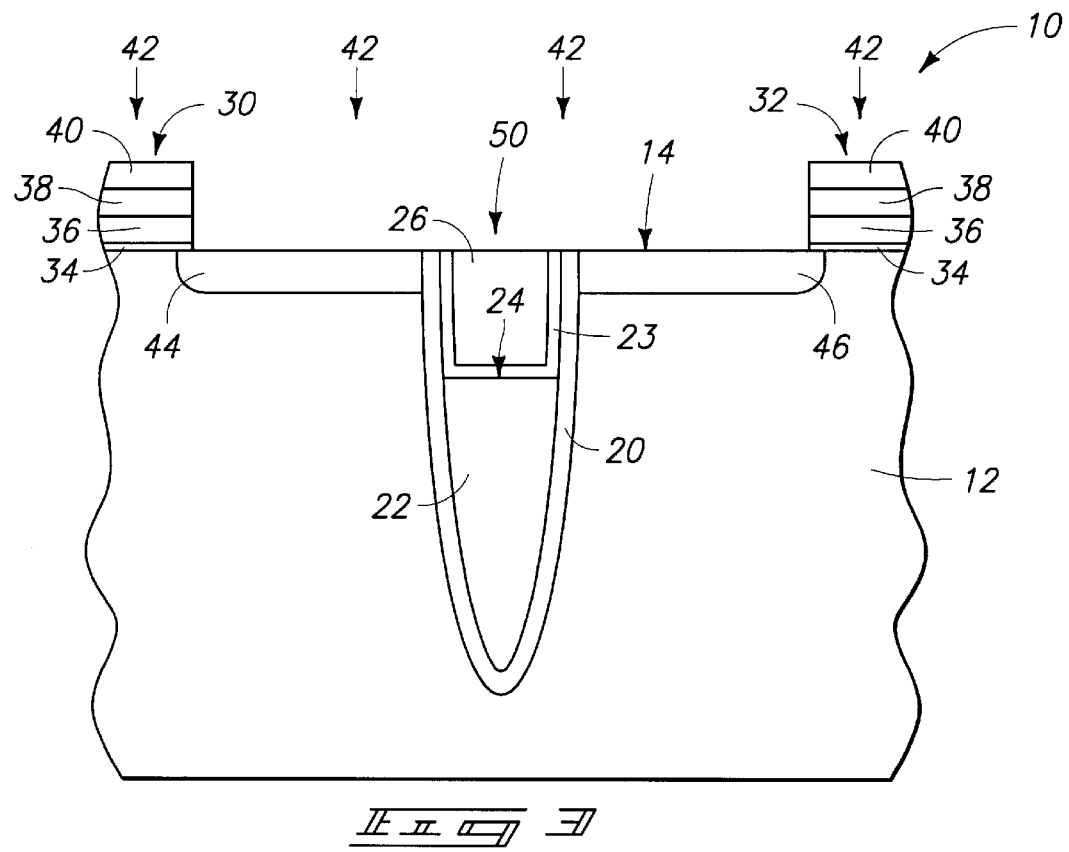
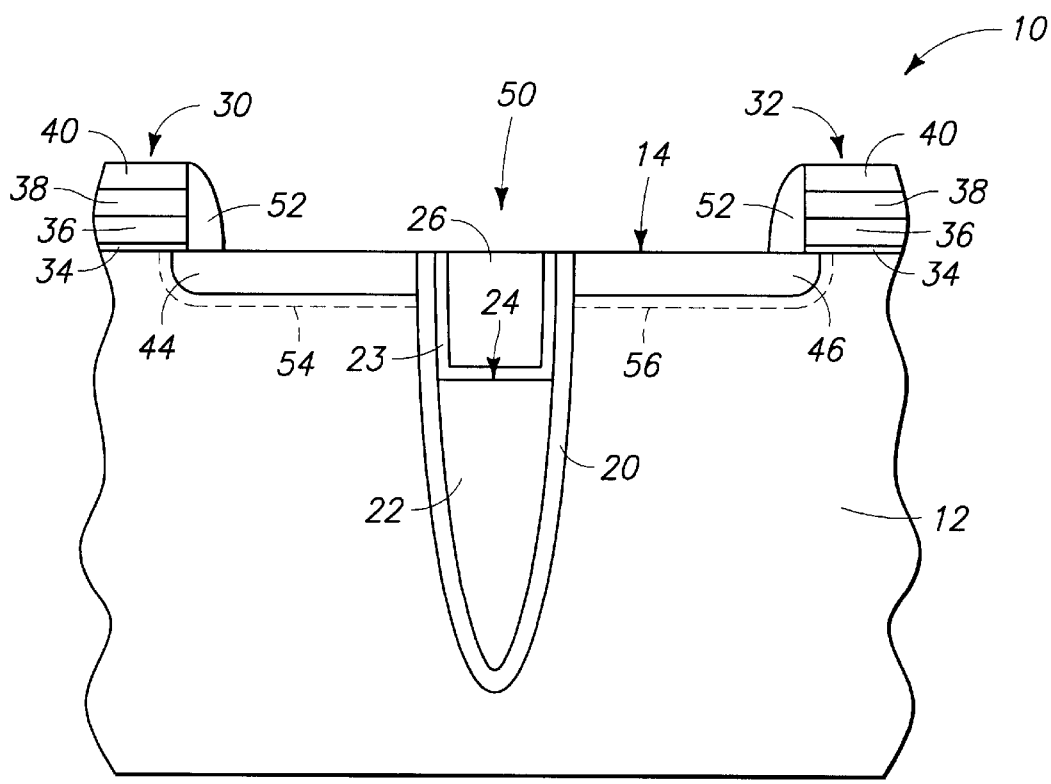

SEMICONDUCTOR CONSTRUCTIONS, AND METHODS OF FORMING SEMICONDUCTOR CONSTRUCTIONS

RELATED PATENT DATA

This patent resulted from a divisional application of U.S. patent application Ser. No. No. 10/177,056, which was filed Jun. 21, 2002.

TECHNICAL FIELD

The invention pertains to semiconductor constructions, and methods of forming semiconductor constructions. In particular applications, the invention pertains to methods of forming isolation regions associated with a semiconductor substrate.

BACKGROUND OF THE INVENTION

There is a continuing demand for increasing the circuit device density associated with semiconductor constructions. Such is generating a continuing demand for improved isolating structures between adjacent circuit devices.

Trench isolation is a fairly typical method of electrically isolating adjacent circuit devices from one another. Trench isolation utilizes a trench etched into a semiconductor substrate between adjacent circuit devices (such as, for example, between memory cells in a DRAM array). The trench is filled with a suitable material to create a physical barrier to current conduction between the adjacent circuit devices.

A material that can be provided within a trench is silicon, such as, for example, polycrystalline silicon, and such material can be separated from a semiconductor substrate comprising the trench (such as, for example, a monocrystalline silicon substrate) by an insulative material formed within a periphery of the trench. There can be advantages to utilizing silicon in a trench isolation region because silicon can be deposited highly-conformally across a substrate. However, various disadvantages are also found to occur. One of the disadvantages is that junction leakage can occur when heavily-doped diffusion regions are proximate the trench isolation region, as doped silicon in the trench can act as a gated diode. The junction leakage can cause numerous problems with semiconductor circuitry utilizing the conductively-doped diffusion regions. For instance, if the conductively-doped diffusion regions are associated with a dynamic random access memory (DRAM) cell, the junction leakage can be detrimental to DRAM retention time.

It would be desirable to develop improved isolation regions, and methodology for forming such isolation regions.

SUMMARY OF THE INVENTION

In one aspect, the invention encompasses an isolation region formed within a semiconductive material. The semiconductive material has a surface and an opening extending through the surface. An electrically insulative liner is provided along a periphery of the opening, and subsequently a mass is formed within a bottom portion of the opening. The mass comprises a mid-gap work function, and in exemplary applications comprises a refractory metal (such as Mo, W, molybdenum silicide or tungsten silicide), silicon (either doped or undoped), and/or SiGe. The mass has a top surface which is recessed beneath the surface of the semiconductive material. An electrically insulative layer is within the opening and over the top surface of the mass.

In one aspect, the invention encompasses a semiconductor construction. The construction includes a first semiconductive material having a surface and an opening extending through the surface. A first electrically insulative material is provided along a periphery of the opening, and subsequently a second semiconductive material is formed within a bottom portion of the opening. The second semiconductive material is separated from the first semiconductive material by the insulative material. The second semiconductive material has a top surface at least about 200 Angstroms beneath the surface of the first semiconductive material. A second electrically insulative material is within the opening and over the top surface of the second semiconductive material.

In one aspect, the invention encompasses a method of forming a semiconductor construction. A first semiconductive material is provided, and such material has a surface and an opening extending through the surface. The first semiconductive material is background doped with a first type dopant. At least one conductively-doped diffusion region extends into the first semiconductive material in a location proximate the opening. The conductively-doped diffusion region extends to a depth within the first semiconductive material and comprises a second-type majority dopant. A second semiconductive material is formed within the opening to partially fill the opening. An insulative material is formed within the opening and over the top surface of the second semiconductive material. The second semiconductive material has a top surface elevationally below the depth of the conductively-doped diffusion region.

BRIEF DESCRIPTION OF THE DRAWINGS

Preferred embodiments of the invention are described below with reference to the following accompanying drawings.

FIG. 1 is a diagrammatic, cross-sectional view of a fragment of a semiconductor construction illustrated at a preliminary stage of a method in accordance with one aspect of the invention.

FIG. 2 is a view of the FIG. 1 fragment shown at a processing stage subsequent to that of FIG. 1.

FIG. 3 is a view of the FIG. 1 fragment shown at a processing stage subsequent to that of FIG. 2.

FIG. 4 is a view of the FIG. 1 fragment shown at a processing stage subsequent to that of FIG. 3.

DETAILED DESCRIPTION OF THE PREFERRED EMBODIMENTS

Figure 5:
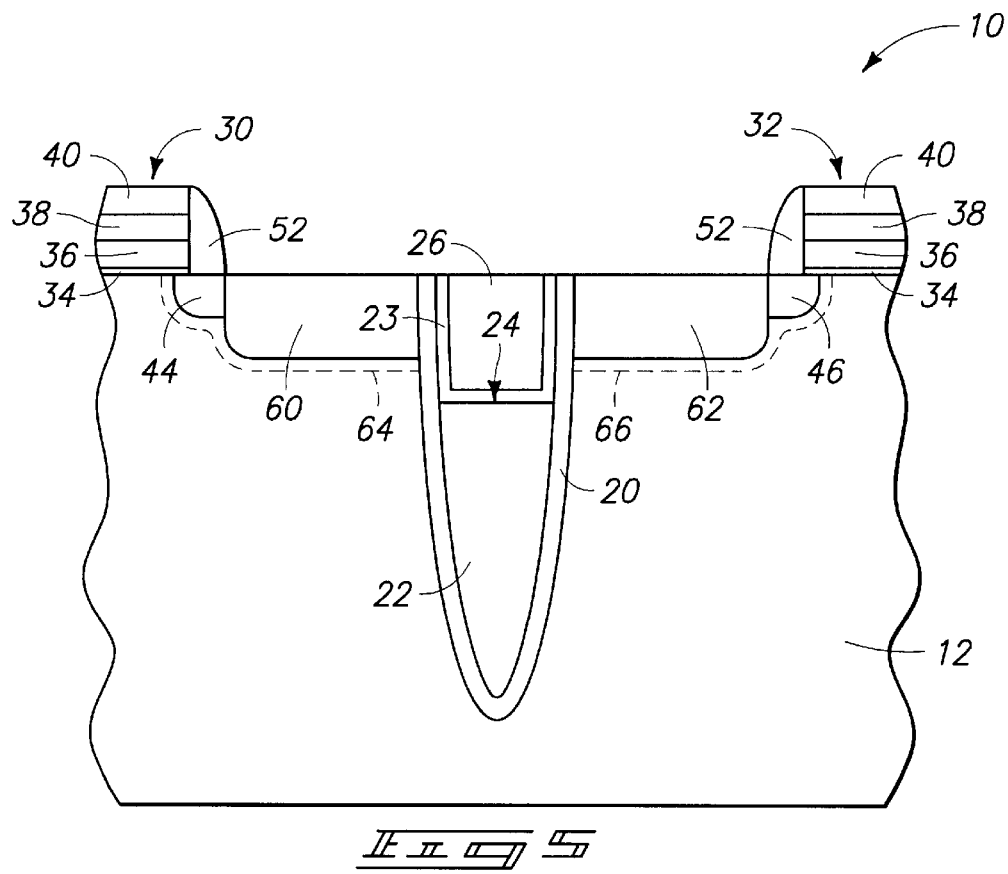
FIG. 5 is a view of the FIG. 1 fragment shown at an optional processing stage subsequent to that of FIG. 4.

A particular aspect in the invention is described with reference to FIGS. 1–4. Referring initially to FIG. 1, a fragment of a semiconductor construction 10 is illustrated.

Construction 10 comprises a semiconductor substrate 12. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In particular applications, substrate 12 can consist essentially of, or consist of monocrystalline silicon. In other applications, substrate 12 can comprise, consist essentially of, or consist of other semiconductive materials in addition to, or alternatively to, monocrystalline silicon. In yet other applications, substrate 12 can consist essentially of, or consist of, monocrystalline silicon doped with appropriate conductivity-enhancing dopants.

Substrate 12 can comprise, for example, monocrystalline silicon lightly doped with a background dopant to a concentration of from about $1 \times 10^{14}$ atoms/cm$^3$ to about $1 \times 10^{16}$ atoms/cm$^3$. The dopant provided within substrate 12 can be either p-type or n-type dopant.

Substrate 12 has an upper surface 14. A layer 11 comprising silicon dioxide and a layer 15 comprising silicon nitride are formed over upper surface 14. Layers 11 and 15 are patterned into a mask. An opening 16 defined by the mask is extended through the upper surface 14 and into the substrate by, for example, reactive ion etching techniques.

Opening 16 can extend at least 0.2 micron deep into substrate 12, or at least about 0.3 micron deep, and in particular applications will extend to a depth of from about 0.2 micron to about 1 micron. Opening 16 has a width 18 at an uppermost location of the opening. Such width can be, for example, about 100 nanometers. Opening 16 can extend into and out of the page, and accordingly can have the configuration of a trench. Alternatively, opening 16 can have other geometrical shapes around a lateral periphery of the opening, such as, for example, a circular or rectangular shape. The shape around the lateral periphery of opening 16 would be apparent from a top view of substrate 12, but is not apparent in the shown cross-sectional side view.

Referring to FIG. 2, layers 11 and 15 (FIG. 1) are removed, and an insulative liner 20 is provided across upper surface 14 of substrate 12 and within opening 16. Liner 20 can comprise, for example, one or both of silicon dioxide and silicon nitride. Liner 20 narrows opening 16.

After formation of liner 20 within opening 16, a material (or mass) 22 is formed within a bottom portion of the narrowed opening 16 to partially fill the opening. Material 22 has a top surface 24 which is beneath the surface 14 of substrate 12, and specifically which is beneath a portion of surface 14 proximate opening 16.

Material 22 can comprise, for example, metal (such as chemical vapor deposited tungsten), and in particular applications can comprise metal silicide. Metal or metal silicide will preferably be subsequently encapsulated to alleviate or prevent oxidation. Metal and/or metal silicide can be used in applications in which low temperature processing is desired. Material 22 can comprise a mid-gap work function, and in exemplary applications comprises a refractory metal (such as Mo, W, or Ta); a silicide (such as molybdenum silicide or tungsten silicide); silicon (either doped or undoped); and/or SiGe (typically doped). A Mid-gap work function of material 22 can be preferred in particular aspects of the invention in which material 22 resides in both p-wells and n-wells. If material 22 comprises a metal, such as W, a layer of TiN can be formed alternatively to, or in addition to, liner 20 along a periphery of the opening.

In some applications of the invention, material 22 can comprise an element which is inherently a semiconductive material (such as silicon). In particular aspects of the invention, such material can be doped to have conductive characteristics. For instance, material 22 can comprise, consist of, or consist essentially of, doped (either n-type or p-type doped) silicon and/or undoped silicon. The silicon can be in the form of, for example, amorphous silicon and/or polycrystalline silicon. The dopant within silicon-containing material 22 can be provided to a concentration of at least about $1 \times 10^{14}$ atoms/cm$^3$ and in particular applications will be provided to a concentration of from about $1 \times 10^{15}$ atoms/cm$^3$ to about $1 \times 10^{21}$ atoms/cm$^3$. In the description that follows, substrate 12 and material 22 can be referred to as first and second semiconductive materials, respectively.

Liner 20 and material 22 can be formed by, for example, chemical vapor deposition. If material 22 is a semiconductive material, it can be formed to be in situ doped, or alternatively can have a dopant implanted therein after provision of the material within opening 16.

An electrically insulating layer 23 of, for example, silicon nitride is provided over material 22 to protect material 22 from subsequent oxidation.

An electrically insulative material 26 is formed within opening 16 and over layer 23 and material 22. In the shown application of the invention, insulative materials 26 and 23, liner 20 and material 22 together fill the opening 16.

Insulative material 26 can comprise, for example, silicon dioxide, phosphosilicate glass (PSG), and/or borophosphosilicate glass (BPSG). It can be preferred, however, that material 26 consist essentially of silicon dioxide.

In particular applications, material 26 can be deposited by a high density plasma deposition utilizing an RF power bias of from 300 W to 900 W, a top electrode power of 1000 W to 5000 W, silane, oxygen, inert gas, a pressure of from 20 mTorr to 70 mTorr and a temperature of from 200° C. to 500° C. An etch-to-deposition ratio of the processing can determine a conformality of coverage of material 26 over underlying features.

In alternative applications, insulative material 26 can be deposited by other processes, including, for example flow fill or sub-atmospheric chemical vapor deposition. It can advantageous, however, to form material 26 by high density plasma deposition because high density plasma deposition can avoid seams that could otherwise occur in a filled gap, and can better fill high aspect ratio gaps. If shallow trenches are filled, there are fewer, if any, advantages of high density plasma deposition, and accordingly sub-atmospheric chemical vapor deposition can be a typical method.

Referring to FIG. 3, construction 10 is illustrated after materials 26, 23 and 20 have been removed from over upper surface 14 of semiconductive substrate 12. Such removal can be accomplished by, for example, chemical-mechanical polishing. It is noted that some of material 12 can be removed during the chemical-mechanical polishing, and accordingly the upper surface 14 of FIG. 3 can be at an elevationally lower level than was the upper surface 14 of FIG. 2.

The materials 12, 20, 22 and 26 are oriented in the construction of FIG. 3 such that insulative liner 20 extends between materials 12 and 22, and between materials 26 and 12. Liner 20 can prevent oxidation of material 22 which could otherwise impart undesired stresses within opening 16 (FIGS. 1 and 2). For example, liner 20 can prevent an oxidation-induced stacking fault.

Wordline stacks 30 and 32 are formed over surface 14 of semiconductive material 12. Wordline stacks 30 and 32 comprise layers 34, 36, 38 and 40. Layer 34 can correspond to insulative material, such as, for example, silicon dioxide; layer 36 can correspond to conductively-doped semiconductive material, such as, for example, conductively-doped polycrystalline silicon; layer 38 can correspond to silicide and/or metal; and layer 40 can correspond to an insulative material cap; such as, for example, a silicon nitride cap. Layers 34, 36, 38 and 40 can be formed and patterned utilizing conventional methods for forming wordline stacks.

After formation of stacks 30 and 32, a dopant 42 is implanted into material 12 to form conductively-doped diffusion regions 44 and 46 (some or all of the dopant can be implanted after formation of spacer 52 (FIG. 4), rather than at the shown processing stage of FIG. 3). Dopant 42 can comprise either n-type or p-type dopant. In particular applications, semiconductive material 12 will be background doped with a first dopant type, and diffusion regions 44 and 46 will be majority-doped with a second dopant type opposite to the first dopant type. For instance, if the first dopant type within substrate 12 is n-type, then conductively-doped diffusion regions 44 and 46 will be majority-doped with p-type dopant. Alternatively, if the first dopant type within semiconductive material 12 is p-type, then conductively-doped diffusion regions 44 and 46 will comprise n-type dopant as the majority dopant. The dopant concentration within regions 44 and 46 is sufficient to overwhelm the background-doping within substrate 12, and can be, for example, such that a net dopant concentration is at least $1 \times 10^{17}$ atoms/cm$^3$.

As discussed above with reference to FIG. 2, material 22 can include one or more of metal, metal silicide, silicon and germanium, and can have a mid-gap work function. In particular applications of the invention, material 22 comprises doped semiconductive material. The semiconductive material can be doped with a dopant which is the same type as that utilized for background doping of substrate 12. Accordingly, if substrate 12 comprises n−(i.e, n minus) doping, then a doped semiconductive material 22 can comprise n+(i.e, n plus) doping, or in other words n-type doping to a concentration greater than that of substrate 12. In a particular example, substrate 12 can be doped to a concentration of from $1 \times 10^{14}$ atoms/cm$^3$ to less than $0.5 \times 10^{17}$ atoms/cm$^3$, and material 22 can be doped to a concentration of at least $1 \times 10^{17}$ atoms/cm$^3$. In another application, substrate 12 can comprise p-doping, and material 22 can comprise p+doped semiconductive material.

Although the majority dopant within a doped semiconductive material 22 can be the same as the dopant within semiconductive material 12 (or in other words, opposite to the majority dopant within conductively-doped diffusion regions 44 and 46), it is noted that the majority dopant within a doped semiconductive material 22 can also be opposite to the background dopant within substrate 12 (or in other words, the same as the majority dopant within conductively-doped diffusion regions 44 and 46). If the majority dopant within a doped semiconductive material 22 is p-type, and the dopant within first semiconductive material 12 is n-type, it can be desired to provide an electrical contact (not shown) to material 22 which can bias the material 22 to a positive potential. Alternatively, if material 22 comprises n-type doped silicon and substrate 12 comprises a background doping of p-type doped silicon, it can be desired to provide an electrical bias to material 22 which biases the material to a negative potential. The electrical contact can also be provided, and even desired, in the previously-described applications in which material 22 comprises semiconductive material doped with a dopant which is the same type as that utilized for background doping of substrate 12, in that the electrical contact can prevent material 22 from being a floating electrical node. The electrical contact can also be desired in applications in which material 22 comprises non-semiconductive materials, such as when material 22 comprises metal or metal silicide.

Diffusion regions 44 and 46 can correspond to source/drain regions associated with transistor structures incorporating stacks 30 and 32, respectively. The materials 20, 22 and 26 can define an isolation region 50 which electrically isolates source/drain region 44 from source/drain region 46. As shown, the top surface 24 of material 22 is beneath a bottom surface of source/drain regions 44 and 46. Such can alleviate or prevent junction leakage caused by GIDL (or gated diode) which could occur if top surface 24 were higher in elevation relative to source/drain regions 44 and 46.

FIG. 4 illustrates construction 10 at a processing stage subsequent to that of FIG. 3, and specifically illustrates sidewall spacers 52 formed along sidewalls of gate stacks 30 and 32. Spacers 52 can comprise, for example, silicon nitride and/or silicon dioxide, and can be formed by anisotropic etching of a material. FIG. 4 also illustrates source/drain regions 44 and 46 in operation, and shows depletion regions 54 and 56 generated proximate the diffusion regions. Top surface 24 of material 22 is beneath the depletion regions, and such can alleviate junction leakage relative to source/drain regions 44 and 46 that could otherwise occur.

A depth of source/drain regions 44 and 46 can vary depending on the intended use of the transistor constructions incorporating the source/drain regions. For instance, if the transistor constructions are utilized as access transistors to memory cells of a DRAM array, the source/drain regions can extend from about 700 Angstroms to about 1,000 Angstroms beneath surface 14. There is, however, a continuing goal to reduce a depth of the source/drain regions, and accordingly it is possible that source/drain regions associated with the memory cells may be only 500 Angstroms deep in a couple of years, or perhaps from about 200 Angstroms to about 300 Angstroms deep in a few years. In contrast, if the source/drain regions are associated with logic circuitry, such as, for example, circuitry peripheral to a DRAM array, the regions can extend to a depth of from about 400 Angstroms to about 500 Angstroms, with depths of from about 200 Angstroms to about 300 Angstroms possibly occurring in a few years. As surface 24 is typically beneath the lowest-most depth of diffusion regions 44 and 46, (and preferably beneath the depth of depletion regions 54 and 56); top surface 24 will preferably be at least 200 Angstroms beneath surface 14 of semiconductive material 12, in particular aspects at least about 300 Angstroms beneath surface 14, in further particular aspects at least about 400 Angstroms beneath surface 14, in yet further particular aspects at least about 500 Angstroms beneath surface 14, and in yet further aspects at least about 700 Angstroms beneath surface 14.

It is noted that the processing of FIGS. 1–4 is exemplary processing, and that various of the processing steps can be omitted or reversed in order. For instance, although opening 16 (FIG. 1) is shown being formed before diffusion regions 44 and 46, it is to be understood that the processing could be reversed. Accordingly diffusion regions 44 and 46 can be provided prior to formation of opening 16.

FIG. 5 illustrates further optional processing that can occur in particular aspects of the invention. Specifically, FIG. 5 illustrates additional diffusion regions 60 and 62 formed to overlap diffusion regions 44 and 46. Diffusion regions 60 and 62 can correspond to heavily-doped source/drain regions associated with logic transistor devices. Source/drain regions 60 and 62 penetrate deeper within material 12 than diffusion regions 44 and 46. Upper surface 24 of material 22 is beneath the lower-most regions of the deep source/drain regions 60 and 62. Depletion regions 64 and 66 are associated with source/drain regions 60 and 62, and upper surface 24 of material 22 is also beneath the depletion regions 64 and 66.

Figure 6:
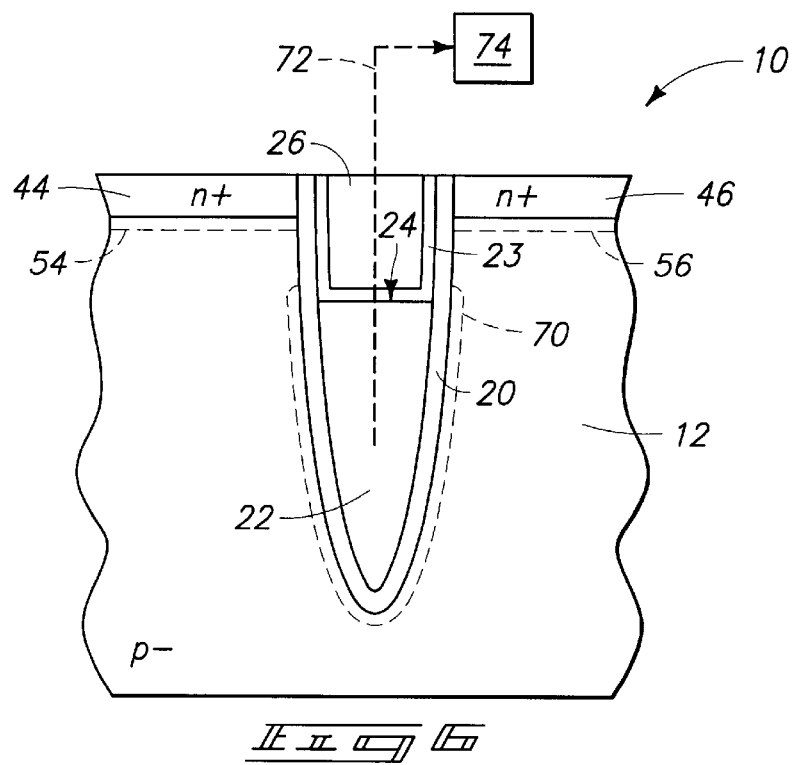
FIG. 6 is a diagrammatic, cross-sectional view of a semiconductor wafer fragment illustrating a particular aspect of the present invention.

Another aspect of the invention is described with reference to FIG. 6. The construction of FIG. 6 can correspond to a portion of the FIG. 4 fragment between wordline stacks 30 and 32. Similar numbering is utilized in describing FIG. 6 as was used above in describing FIG. 4, where appropriate. Material 12 of FIG. 6 is illustrated as being p-background doped semiconductive material, and diffusion regions 44 and 46 are illustrated as being n+doped. The p-type doping within material 12 can be to a concentration of, for example, from about $1 \times 10^{14}$ atoms/cm$^3$ to about $1 \times 10^{16}$ atoms/cm$^3$; and the n-type doping within diffusion regions 44 and 46 can be to a concentration of, for example, at least about $1 \times 10^{17}$ atoms/cm$^3$.

Semiconductive material 22 can be heavily doped with p-type dopant (i.e., can be doped to a concentration of at least $1 \times 10^{17}$ atoms/cm$^3$). In operation, depletion regions 54 and 56 are formed beneath conductively-doped diffusion regions 44 and 46, and an accumulation region 70 is generated within semiconductive material 12 and around p-type doped semiconductive material 22 at close to 0 bias.

Another way to generate accumulation region 70 is to form an n-type heavily-doped semiconductive material 22, and subsequently electrically bias such material to a negative potential. An electrical contact 72 is illustrated extending from semiconductive material 22 to an electrical node 74. Node 74 can be at a suitable potential to negatively bias material 22, and accordingly form accumulation region 70 even in circumstances in which material 22 comprises n-type doped semiconductive material. Although the electrical bias can be eliminated when semiconductive material 22 comprises p-type doped material, it is to be understood that there can be applications in which the bias is also provided for a p-type doped semiconductive material 22. The electrical bias can even be desired for p-type doped semiconductive material, since floating nodes can be problematic.

Figure 7:
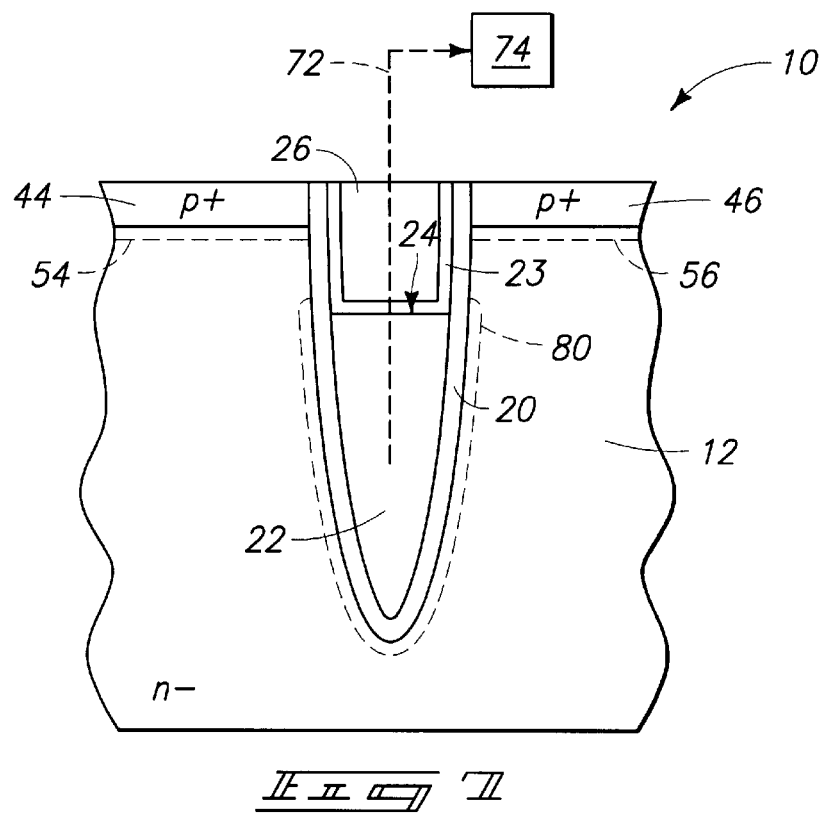
FIG. 7 is a diagrammatic, cross-sectional view of a semiconductor wafer fragment illustrating a particular aspect of the present invention.

FIG. 7 illustrates another aspect of the invention. In referring to FIG. 7, identical numbering is utilized as was used above in describing FIG. 6, where appropriate. The difference between FIG. 7 and FIG. 6 is that diffusion regions 44 and 46 are heavily-doped with p-type dopant (rather than the n-type dopant of FIG. 6), and semiconductive material 12 is background doped with n-dopant (rather than the p-dopant of FIG. 6). The operation of the device of FIG. 7 can be similar to that described above with reference to FIG. 6. However, it can be advantageous to utilize n-type doped semiconductive material 22. The n-type doped material generates an n-type accumulation region 80 Within material 12 and around semiconductive material 22, rather than the p-type accumulation region 70 of FIG. 6. The n-type accumulation region 80 can also be generated if a heavily-p-type doped semiconductive material 22 is utilized together with a suitable positive electrical bias. Such bias can be provided by setting electrical node 74 to a suitable potential. Further, even in applications in which material 22 comprises n-type doped semiconductive material, it can be advantageous to provide a positive bias during operation of the FIG. 7 construction.

Figure 8:
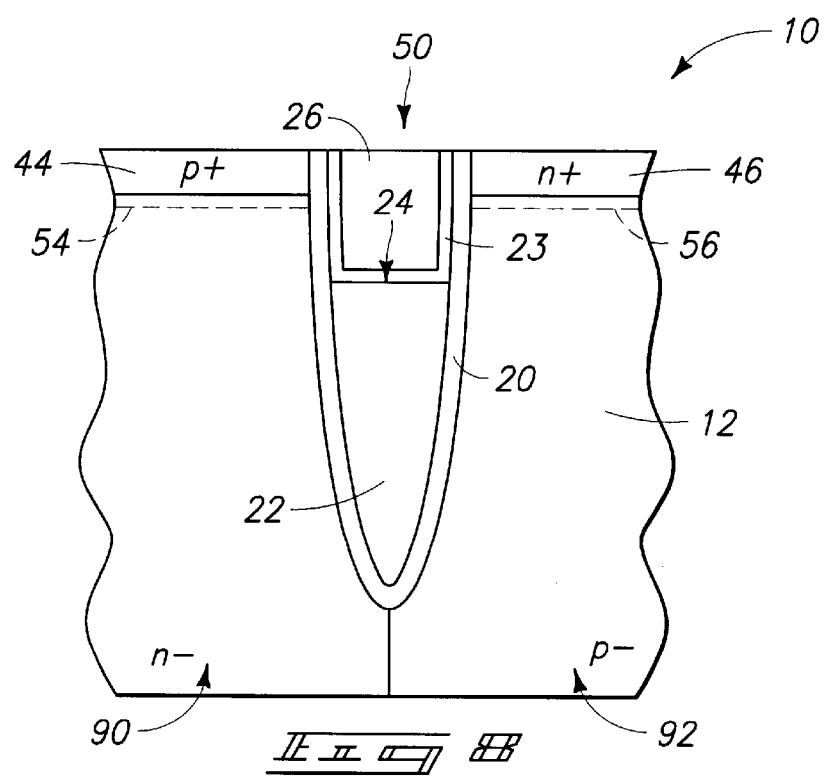
FIG. 8 is a diagrammatic, cross-sectional view of a semiconductor wafer fragment illustrating a particular aspect of the present invention.

FIG. 8 illustrates another application of the invention. Similar numbering is utilized in describing FIG. 8 as was used above in describing FIG. 6. The FIG. 8 embodiment illustrates semiconductive material 12 comprising an n-type doped region (or n-well region) 90 and a p-type doped region (or p-well region) 92. Diffusion regions 44 and 46 are p+doped and n+doped, respectively. Isolation region 50 electrically isolates the p+doped region from the n+doped region. The construction of FIG. 8 can be utilized in, for example, CMOS n-well and p-well constructions. The material 22 can preferably comprise a mid-gap work function, and accordingly can comprise a refractory metal (such as, for example, Mo, W), a metal silicide (such as, for example, molybdenum silicide or tungsten silicide), silicon (either doped or undoped), and/or appropriately doped SiGe. In particular applications, material 22 can comprise either heavily p-type doped semiconductive material or heavily n-type doped semiconductive material, and can be connected to an appropriate potential (not shown) to bias the material 22 as desired for achieving suitable isolation between regions 44 and 46.

Figure 9:
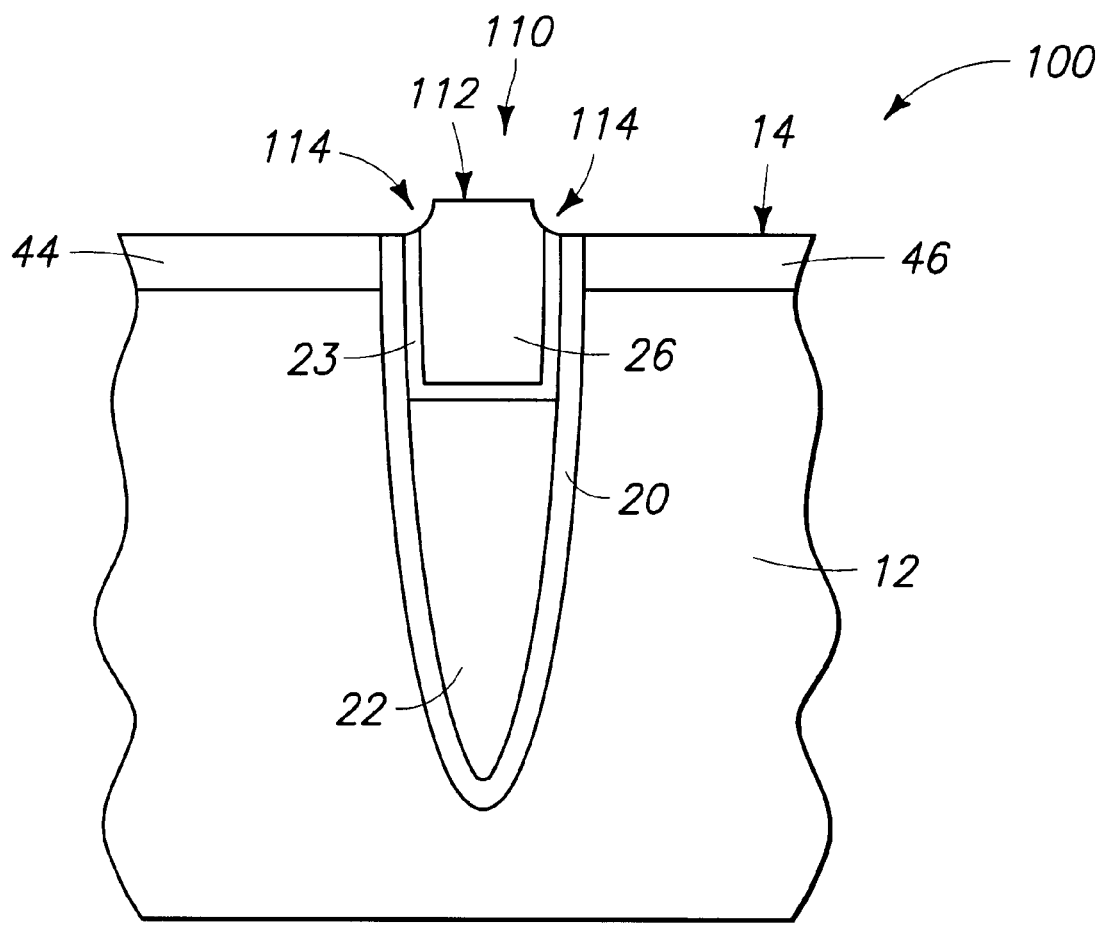
FIG. 9 is a diagrammatic, cross-sectional view of a semiconductor wafer fragment illustrating a particular aspect of the present invention.

FIG. 9 illustrates yet another aspect of the invention. FIG. 9 can correspond to a processing step subsequent to that of FIG. 2, and accordingly can correspond to alternative processing stage relative to that of FIG. 3. In describing FIG. 9, similar numbering will be used as was used above in describing FIGS. 2 and 3, where appropriate. FIG. 9 illustrates a semiconductor wafer construction 100 comprising a first semiconductive material 12 having diffusion regions 44 and 46 formed therein. Construction 100 also comprises an isolation region 110 comprising insulative liner 20, second semiconductive material 22, and insulative material 26. A difference between the construction 100 of FIG. 9 and the construction 10 of FIG. 3 is in the relative shapes of isolation regions 110 and 50. Specifically, isolation region 110 has an upper surface 112 above the upper surface 14 of semiconductive material 12, whereas isolation region 50 has an upper surface which is planar with the upper surface 14 of semiconductive material 12.

The construction of FIG. 9 can result from various processes, including a chemical-mechanical polishing (CMP) process. For instance, layers 23 and 24 (FIG. 2) can be provided before removal of layers 11 and 15 (FIG. 1), and subjected to CMP to remove layers 23 and 24 from over layers 11 and 15. Subsequently, layers 11 and 15 can be removed to leave the resulting structure of FIG. 9. It is noted that the insulative material 26 of FIG. 9 has curved sidewall edges 114. Such curved edges can result from a CMP process. However, various processes could alternatively, or additionally, be utilized to form more square edges.

Among the advantages of the invention described herein is that the use of a partial field shield (the material 22) and partial insulator fill material (the material 26) can avoid or eliminate difficulties associated with attempting to fill a deep opening entirely with oxide. Specifically, it is typically found that it is difficult to conformally fill oxide within a deep opening, and that various disclosed compositions of material 22 (such as, for example, polysilicon) are easier to provide within the opening. The invention can also allow low junction leakage and low parasitic capacitance to be achieved between an isolation region and conductively-doped diffusion regions proximate the isolation region. Further advantages are that the invention can allow less gate induced drain leakage (GIDL) relative to regions proximate the isolation region. Additionally, the separation of the accumulation region of a p well from storage node junctions can improve refresh and cell-to-cell isolation within DRAM memory arrays. Also, having the field shield electrode 22 beneath the junction and away from a surface of material 12 can result in less capacitive coupling with gate electrodes than would otherwise occur.

It is noted that field shield electrodes formed in accordance with the present invention can be separated with a chemical-mechanical polish (CMP) and wet etch recess, which can facilitate an independent bias for each type of intra-well isolation. If concepts described herein are applied to inter-well isolation, such concepts can improve packing density.

It is noted that although several specific applications of the invention are described with reference to material 22 comprising a doped semiconductive material, and specifically a doped silicon material, it is to be understood that other compositions of material 22 discussed herein (such as compositions having mid-gap work functions) can be utilized in such applications in addition to, or alternatively to, the doped semiconductive materials described in the specific applications.

The use of high density plasma deposited oxide 26 in accordance with particular aspects of the invention can reduce a high aspect ratio associated with an opening in a semiconductive material (opening 16 of FIG. 2). The high density plasma oxide can also provide a natural interface during gate oxide and/or transistor gate formation which can be utilized for example, as a gate electrode etch stop.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor construction, comprising:
   a semiconductive mass;
   a pair of devices supported by the mass and separated from one another by an isolation region, the isolation region comprising:
     an opening extending into the semiconductive mass, the opening having a periphery;
     an electrically insulative liner along the periphery of the opening;
     a material within a bottom portion of the opening and over the liner, the material only partially filling the opening, the material having a top surface;
     an electrically insulative layer formed along an inside peripheral surface and in the form of a receptacle within the opening and over the top surface of the material; and
     the top surface of the material being at least about 200 Å beneath the surface of the semiconductive mass.

2. The construction of claim 1 one of the devices is associated with a p-well region of the semiconductive mass and the other of the devices is associated with an n-well region of the semiconductive mass; and the opening extends into both of the p-well and n-well regions of the semiconductive mass.

3. The construction of claim 1 wherein the material comprises a metal silicide.

4. The construction of claim 1 wherein the material comprises consists essentially of a metal silicide.

5. The construction of claim 1 wherein the material comprises a metal.

6. The construction of claim 1 wherein the material consists essentially of a metal.

7. The construction of claim 1 wherein the material comprises tungsten.

8. The construction of claim 1 wherein the material consists essentially of tungsten.

9. The construction of claim 1 wherein the material comprises silicon.

10. The construction of claim 1 wherein the material consists essentially of doped silicon.

11. The construction of claim 1 wherein the material comprises silicon and germanium.

12. The construction of claim 1 wherein the material consists essentially of silicon and germanium.

13. The construction of claim 1 wherein the material consists essentially of silicon, germanium and a dopant within the silicon and germanium.

14. A semiconductor construction, comprising:
    a first semiconductive material having a surface and an opening extending therein;
    a second semiconductive material within a bottom portion of the opening and only partially filling the opening, the second semiconductive material having a top surface;
    an electrically insulative material formed along an inside peripheral surface and in the form of a receptacle within the opening and over the top surface of the second semiconductive material; and
    the top surface of the second semiconductive material being at least about 200 Å beneath the surface of the first semiconductive material.

15. The construction of claim 14 wherein the insulative material comprises silicon dioxide.

16. The construction of claim 14 further comprising an electrically insulative liner extending between the second semiconductive material and the first semiconductive material.

17. The construction of claim 16 wherein the insulative liner narrows the opening extending into the first semiconductive material; and wherein the insulative material and second semiconductive material together fill the narrowed opening.

18. The construction of claim 16 wherein the first and second semiconductive materials comprise silicon, and wherein the insulative liner comprises silicon nitride.

19. The construction of claim 16 wherein the insulative liner extends between the insulative material and the first semiconductive material; wherein the insulative material comprises silicon dioxide, and wherein the insulative liner comprises silicon nitride.

20. The construction of claim 14 wherein the second semiconductive material top surface is at least about 300 Å beneath the surface of the first semiconductive material.

21. The construction of claim 14 wherein the second semiconductive material top surface is at least about 400 Å beneath the surface of the first semiconductive material.

22. The construction of claim 14 wherein the second semiconductive material top surface is at least about 500 Å beneath the surface of the first semiconductive material.

23. The construction of claim 14 wherein the second semiconductive material top surface is at least about 700 Å beneath the surface of the first semiconductive material.

24. The construction of claim 14 wherein the opening is at least about 0.3 micron deep within the first semiconductive material.

25. The construction of claim 14 wherein the opening is from about 0.2 micron deep within the first semiconductive material to about 1 micron deep within the first semiconductive material.

26. The construction of claim 14 wherein the first semiconductive material comprises monocrystalline silicon.

27. The construction of claim 14 wherein the first semiconductive material comprises n-type doped silicon, and wherein the second semiconductive material also comprises n-type doped silicon.

28. The construction of claim 14 wherein the first semiconductive material comprises p-type doped silicon, and wherein the second semiconductive material also comprises p-type doped silicon.

29. The construction of claim 14 wherein the first semiconductive material comprises n-type doped silicon, wherein the second semiconductive material comprises p-type doped silicon; and wherein the second semiconductive material is electrically biased to a positive potential.

30. The construction of claim 14 wherein the first semiconductive material comprises p-type doped silicon, and wherein the second semiconductive material comprises n-type doped silicon; and wherein the second semiconductive material is electrically biased to a negative potential.

31. A semiconductor construction, comprising:
a first semiconductive material having a surface and an opening extending therein, the first semiconductive material being background doped with a first type dopant;
at least one conductively-doped diffusion region extending into the first semiconductive material in a location proximate the opening, the at least one conductively-doped diffusion region extending to a depth within the first semiconductive material and comprising a second-type majority dopant, one of the first and second dopant types being n-type and the other being p-type;
a second semiconductive material within a bottom portion of the opening and only partially filling the opening, the second semiconductive material having a top surface elevationally below the depth of the conductively-doped diffusion region; and
an insulative material within the opening and over the top surface of the second semiconductive material.

32. The construction of claim 31 wherein the opening is between a pair of the conductively-doped diffusion regions, and wherein the opening and materials therein electrically isolate the conductively-doped diffusion regions of said pair from one another.

33. The construction of claim 31 wherein the insulative material comprises silicon dioxide.

34. The construction of claim 31 further comprising an electrically insulative liner extending between the second semiconductive material and the first semiconductive material.

35. The construction of claim 34 wherein the insulative liner narrows the opening extending into the first semiconductive material; and wherein the insulative material and second semiconductive material together fill the narrowed opening.

36. The construction of claim 34 wherein the first and second semiconductive materials comprise silicon, and wherein the insulative liner comprises silicon nitride.

37. The construction of claim 34 wherein the insulative liner extends between the insulative material and the first semiconductive material; wherein the insulative material comprises silicon dioxide, and wherein the insulative liner comprises silicon nitride.

38. The construction of claim 31 wherein the depth of the conductively-doped diffusion region is at least about 200 Å beneath the surface of the first semiconductive material.

39. The construction of claim 31 wherein the depth of the conductively-doped diffusion region is at least about 300 Å beneath the surface of the first semiconductive material.

40. The construction of claim 31 wherein the depth of the conductively-doped diffusion region is at least about 400 Å beneath the surface of the first semiconductive material.

41. The construction of claim 31 wherein the depth of the conductively-doped diffusion region is at least about 500 Å beneath the surface of the first semiconductive material.

42. The construction of claim 31 wherein the depth of the conductively-doped diffusion region is at least about 700 Å beneath the surface of the first semiconductive material.

43. The construction of claim 31 wherein the first semiconductive material comprises monocrystalline silicon.

44. The construction of claim 31 wherein the first semiconductive material comprises silicon; wherein the first type dopant is n-type dopant; and wherein the second semiconductive material comprises n-type doped silicon.

45. The construction of claim 31 wherein the first semiconductive material comprises silicon; wherein the first type dopant is p-type dopant; and wherein the second semiconductive material comprises p-type doped silicon.

46. A semiconductor device, comprising:
a first semiconductive material having a surface and an opening extending therein;
a second semiconductive material provided in the opening and having a top surface;
an electrically insulative material within the opening and over the top surface of the second semiconductive material; and
wherein the top surface being elevationally below a depth of a conductively-doped diffusion region formed in the first semiconductive material.

47. A semiconductor construction, comprising:
a first semiconductive material having an opening extending therein;
a second semiconductive material provided in the opening;
an insulative liner formed only along an inside periphery of the opening and over a top surface of the second semiconductive material; and
wherein the top surface is elevationally below a depth of a conductively-doped diffusion region formed in the first semiconductive material.

* * * * *

UNITED STATES PATENT AND TRADEMARK OFFICE
CERTIFICATE OF CORRECTION

PATENT NO. : 6,720,638 B2
DATED : April 13, 2004
INVENTOR(S) : Luan C. Tran

It is certified that error appears in the above-identified patent and that said Letters Patent is hereby corrected as shown below:

Column 1,
Line 8, please delete "No." after "No.".

Column 7,
Line 59, please delete "Within" after "80" and insert -- within --.

Column 9,
Line 59, please insert -- wherein -- after "claim 1".

Column 10,
Line 2, please delete "comprises" before "consists".

Signed and Sealed this

Twenty-first Day of December, 2004

JON W. DUDAS
*Director of the United States Patent and Trademark Office*